(12) United States Patent
Mizoguchi et al.

(10) Patent No.: US 7,145,351 B2
(45) Date of Patent: Dec. 5, 2006

(54) ELECTRICAL INSPECTION APPARATUS

(75) Inventors: Yasunori Mizoguchi, Hamamatsu (JP); Toru Ishii, Hamamatsu (JP); Kengo Tsuchida, Hamamatsu (JP)

(73) Assignee: Yamaha Fine Technologies Co., Ltd (JP)

( * ) Notice: Subject to any disclaimer, the term of this patent is extended or adjusted under 35 U.S.C. 154(b) by 177 days.

(21) Appl. No.: 10/761,344

(22) Filed: Jan. 22, 2004

(65) Prior Publication Data

US 2004/0207423 A1    Oct. 21, 2004

(30) Foreign Application Priority Data

Jan. 23, 2003    (JP) .................... P2003-014146

(51) Int. Cl.
    *G01R 31/02*    (2006.01)
(52) U.S. Cl. ................ 324/754; 324/538; 324/158.1; 324/761
(58) Field of Classification Search ............... None
    See application file for complete search history.

(56) References Cited

U.S. PATENT DOCUMENTS

| | | | | |
|---|---|---|---|---|
| 5,818,248 A | * | 10/1998 | St. Onge | 324/761 |
| 5,889,407 A | * | 3/1999 | Nucci | 324/754 |
| 5,894,225 A | * | 4/1999 | Coffin | 324/762 |
| 6,118,292 A | * | 9/2000 | Antonello et al. | 324/758 |
| 6,900,648 B1 | * | 5/2005 | Ou et al. | 324/755 |
| 2004/0075456 A1 | * | 4/2004 | Zhao et al. | 324/755 |

FOREIGN PATENT DOCUMENTS

| | | |
|---|---|---|
| JP | 11-243271 | 9/1999 |
| JP | HEI 11-340588 | 12/1999 |
| JP | 2000-9785 | 1/2000 |

OTHER PUBLICATIONS

Korean Office Action issued Aug. 31, 2005 (w/ English translation of relevant portions).

* cited by examiner

*Primary Examiner*—Jermele Hollington
*Assistant Examiner*—Jimmy Nguyen (57) ABSTRACT

An electrical inspection apparatus performs highly accurate electrical inspection using an inspection probe on any type of printed board without changing an instrument therefor. It comprises a reference position regulating member for positioning the printed board precisely at a predetermined reference position and a pressing member for pressing the printed board oppositely to the reference position regulating member. An inspected portion (e.g., a contact) of the printed board is fixed under tension and is precisely located at the reference position in planar condition by being contacted and positioned by the reference position regulating member, whereby it is subjected to electrical inspection using the inspection probe accompanied with the reference position regulating member and/or the pressing member. Thus, it is possible to prevent the inspection probe from being unexpectedly damaged or destroyed by excessive force that is produced due to inaccurate positioning therefor.

13 Claims, 7 Drawing Sheets

ELECTRICAL INSPECTION APPARATUS

BACKGROUND OF THE INVENTION

1. Field of the Invention

This invention relates to electrical inspection apparatuses that perform electrical inspection by bringing inspection probes into contact with printed circuit boards (or printed wiring boards).

This application claims priority on Japanese Patent Application No. 2003-14146, the content of which is incorporated herein by reference.

2. Description of the Related Art

Conventionally, printed circuit boards (simply referred to as printed boards) having electrode patterns are subjected to inspection upon detection of electrical conduction of wiring thereof In this case, an inspection apparatus is used to perform inspection by bringing an inspection probe thereof into contact with each of the contacts, which have the structure allowing detection of electrical conduction upon electrification via contact terminals and the like, are arranged on a printed board, an example of which is disclosed in Japanese Patent Application Publication No. Hei 11-340588. This inspection apparatus uses a printed board in which a circuit pattern is formed on an insulating film in which numerous contacts are arranged on the surface and are conducted with the circuit pattern, wherein a prescribed material such as copper having plastic deformation ability is used for the circuit pattern. In inspection, a printed board is fixed onto the upper surface of an inspection instrument, which is horizontally arranged; then, an inspection probe descends down to the printed board and is brought into contact with a prescribed contact of the printed board, thus performing inspection as to whether or not an electrical conduction is established.

However, the aforementioned inspection apparatus may sometimes fail to perform inspection in a stable manner with a sufficiently high accuracy. When inspection is performed on a flexible printed board, for example, the flexible printed board is kept wound up in a roll, so that it may not always maintain a planar condition. For this reason, when such a flexible printed board is subjected to inspection by the inspection apparatus, the printed board may be deflected in shape so that an inspection probe cannot be reliably brought into contact with a prescribed contact of the printed board. Even when the inspection apparatus is equipped with a fine inspection probe having a high positioning accuracy, the fine inspection probe may be easily damaged due to the deflection or deformation of the printed board beyond physical tolerance thereof.

SUMMARY OF THE INVENTION

It is an object of the invention to provide an electrical inspection apparatus that can perform inspection on a printed board in a stable manner with a relatively high accuracy. In particular, the electrical inspection apparatus of this invention has an ability to perform electrical inspection such as electrical conduction inspection and resistance inspection with a relatively high accuracy without changing an inspection instrument thereof, which can be applied to flexible printed boards as well as different types and different sizes of printed boards without problem. In addition, the electrical inspection apparatus of this invention can prevent an inspection probe thereof from being damaged or destroyed by establishing appropriate positioning for fixing printed boards onto the inspection instrument thereof.

This invention provides an electrical inspection apparatus that can perform a highly accurate electrical inspection on any type of printed board without changing an instrument therefor, wherein an inspection probe can be prevented from being unexpectedly damaged or destroyed by excessive force that is produced due to inaccurate positioning therewith when brought into contact with the printed board.

Specifically, the electrical inspection apparatus performs an electrical inspection using the inspection probe on the printed board having first and second surfaces (or lower-side and upper-side surfaces) and numerous contacts arranged on at least one surface, wherein it comprises a first surface fixing member or a reference position regulating member or a lower-side fixing member for positioning the first surface of the printed board precisely at the reference position that is determined in advance in the normal direction, and a second surface fixing member or a pressing member or an upper-side fixing member for pressing the second surface of the printed board oppositely to the first fixing member. It is possible to provide the first surface fixing member and/or the second surface fixing member with absorbing members for absorbing the printed board. The inspection probe can be arranged to accompany with the first surface fixing member or the second surface fixing member. Herein, the first surface fixing member is lowered and is automatically stopped when coming into contact with the printed board, which is thus located at the reference position on the second surface fixing member.

Thus, an inspected portion (e.g., a contact) of the printed board can be reliably subjected to electrical inspection because it is precisely located at the reference position in the planar condition, so that the inspection probe can be accurately located and brought into contact with the inspected portion of the printed board, which is fixedly maintained in the planar condition by being contacted and positioned by the first surface fixing member.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

This invention will be described in further detail by way of examples with reference to the accompanying drawings.

Figure 1:
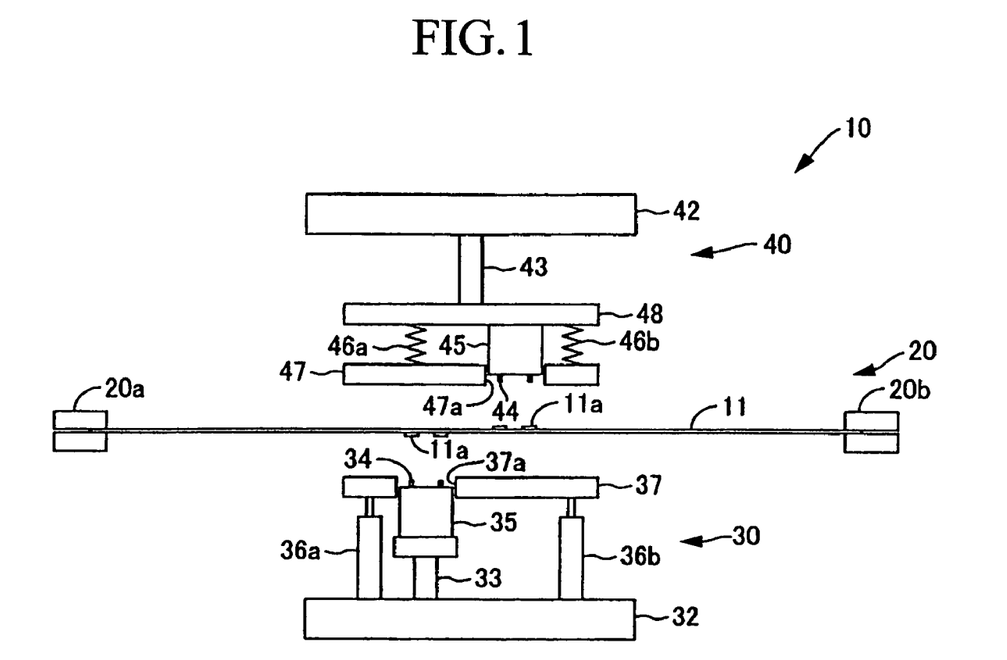
FIG. 1 is a simplified illustration showing essential parts of an electrical inspection apparatus in accordance with a preferred embodiment of the invention.

FIG. 1 is a simplified illustration showing essential parts of an inspection apparatus for use in inspection of a printed board in accordance with a preferred embodiment of the invention. That is, an inspection apparatus 10 shown in FIG. 1 performs inspection as to whether or not an electrical conduction is appropriately established on electrode patterns (not shown) arranged on a printed board 11, which is an inspected subject. The inspection apparatus 10 comprises a setup unit 20 for setting up the printed board 11 at a prescribed position, a lower-side inspection unit 30 arranged below the printed board 11, and an upper-side inspection unit 40 arranged above the printed board 11.

The aforementioned lower-side inspection unit 30 and upper-side inspection unit 40 are combined together to form a measurement unit. The printed board 11 is formed using a square or rectangular sheet having flexibility, wherein contacts 11a respectively conduced with electrode patterns are arranged on both surfaces of the printed board 11.

All of the setup unit 20, lower-side inspection unit 30, and upper-side inspection unit 40 are mounted on a base unit 12 and are respectively driven by drivers (details of which will be described in conjunction with FIGS. 2 and 3), by which they can move independently. The base unit 12 is constituted by a frame-like base in which a window-like hole 13 is formed on the upper surface thereof. A pair of support units 20a and 20b forming the aforementioned setup unit 20 are respectively arranged on the left and right of the hole 13 formed on the upper surface of the base unit 12.

The support unit 20a is constituted by a rail 21a, which is arranged along one end of the hole 13, and a pair of support members 22a and 26a, which can move along the rail 21a. The support member 22a is constituted by a driving section 23a, which comprises a tracking section extended in approaching-estranging directions relative to the printed board 11 and a driver formed by a cylinder and the like, and a moving section 24a that can move along the tracking section by driving the driver. A holder 25a for fixedly holding the prescribed corner of the printed board 11 is formed at the tip end of the moving section 24a.

Figure 2:
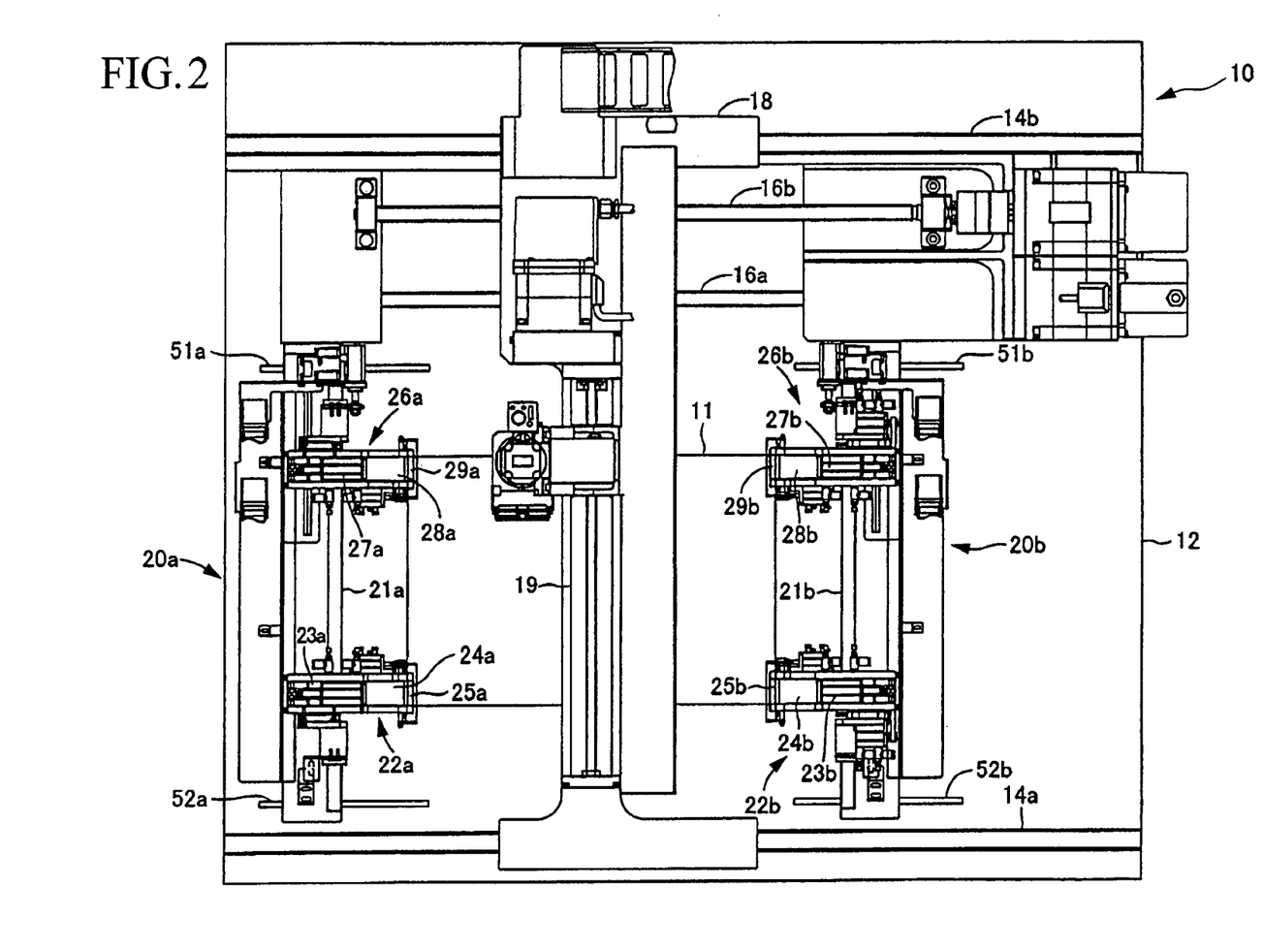
FIG. 2 is a plan view showing mechanical and electrical parts of the electrical inspection apparatus.
Figure 3:
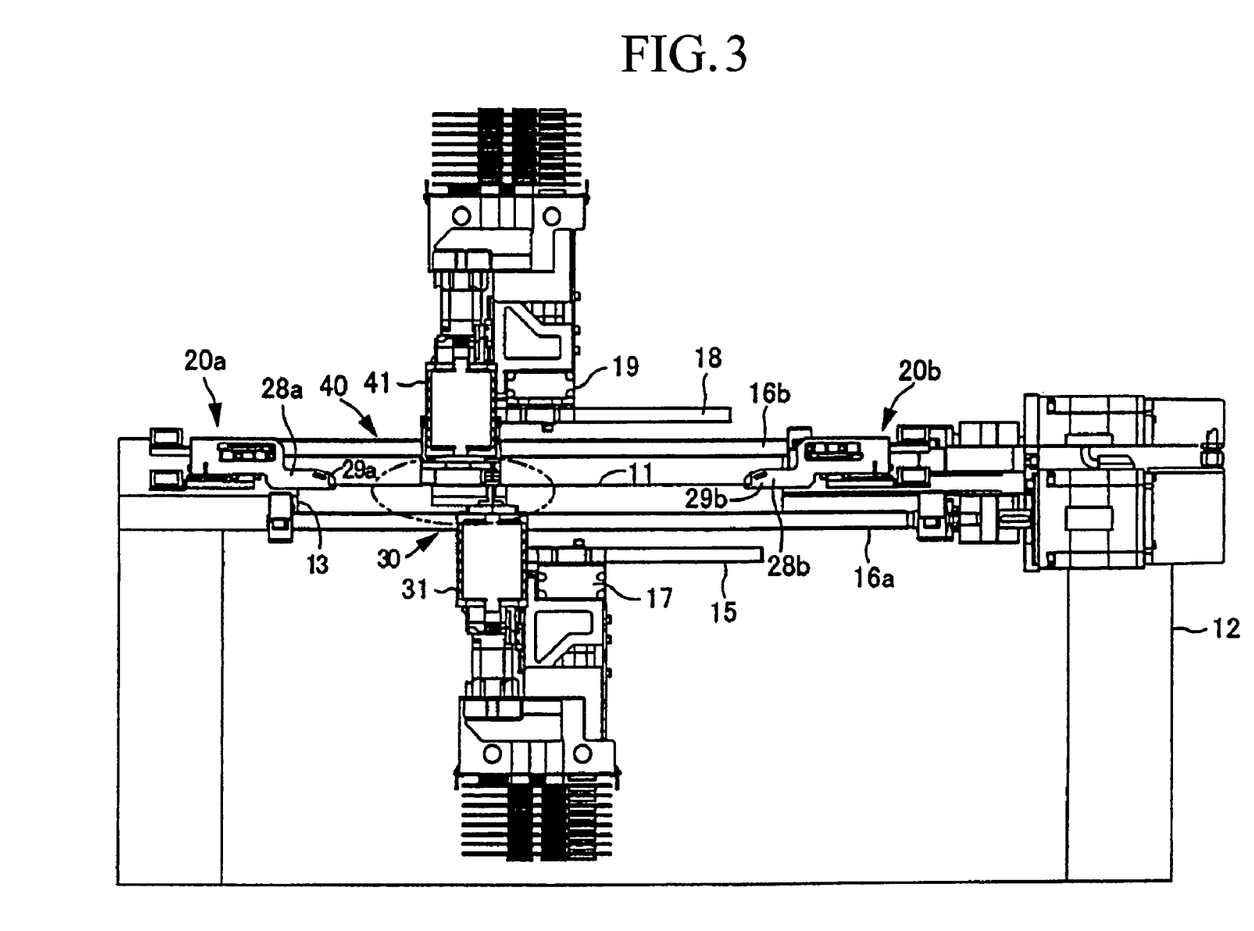
FIG. 3 is a front view showing various parts of the electrical inspection apparatus.

The support member 26a is constituted similarly to the aforementioned support member 22a, wherein it comprises a driving section 27a and a moving section 28a. A holder 29a is formed at the tip end of the moving section 28a. The support members 22a and 26a can move respectively such that a distance therebetween can be freely increased or reduced, whereby the distance between the support members 22a and 26a can be adjusted to suit the width of the printed board 11. The support unit 20a is arranged to move along a pair of rails 51a and 52a, which are located apart from each other as shown in FIG. 2, so that it is subjected to prescribed positioning in response to the length of the printed board 11.

The support unit 20b is arranged symmetrically with the support unit 20a and is constituted similarly to the support unit 20a. That is, the support unit 20b is constituted by a rail 21b, and a pair of support members 22b and 26b that can move along the rail 21b. The support member 22b comprises a driving section 23b and a moving section 24b. A holder 25b is formed at the tip end of the moving section 24b.

Similarly, the support member 26b comprises a driving section 27b and a moving section 28b; and a holder 29b is formed at the tip end of the moving section 28b.

The support members 22b and 26b can move respectively such that a distance therebetween can be freely increased or reduced, whereby the distance between the support members 22b and 26b can be adjusted to suit the width of the printed board 11. The support unit 20b is arranged to move along a pair of rails 51b and 52b, which are located apart from each other as shown in FIG. 2, so that it is subjected to prescribed positioning in response to the length of the printed board 11. In the support unit 20a, the moving sections 24a and 28a can move along the tracks of the driving sections 23a and 27a. In the support unit 20b, the moving sections 24b and 28b can move along the tracks of the driving sections 23b and 27b. Thus, the printed board 11 is firmly supported under tension by the four moving sections 24a, 28a, 24b, and 28b, which are interlocked in mutual movement such that their holders 25a, 29a, 25b, and 29b fixedly hold the four corners of the printed board 11.

The lower-section inspection unit 30 is attached to a support base 15, which can move along lower surfaces of rails 14a and 14b, which are paired and are arranged on the upper surface of the base unit 12 to separated from each other in forward-backward directions. Upon being driven by a rotary drive device 16a, the support base 15 can be moved along the rails 14a and 14b in left-right directions in FIG. 2, wherein it is located at a prescribed position beneath the printed board 11. The support base 15 is equipped with a drive device 17 that comprises a tracking section and a rotary shaft section (details of which are not shown in FIG. 3).

Figure 4:
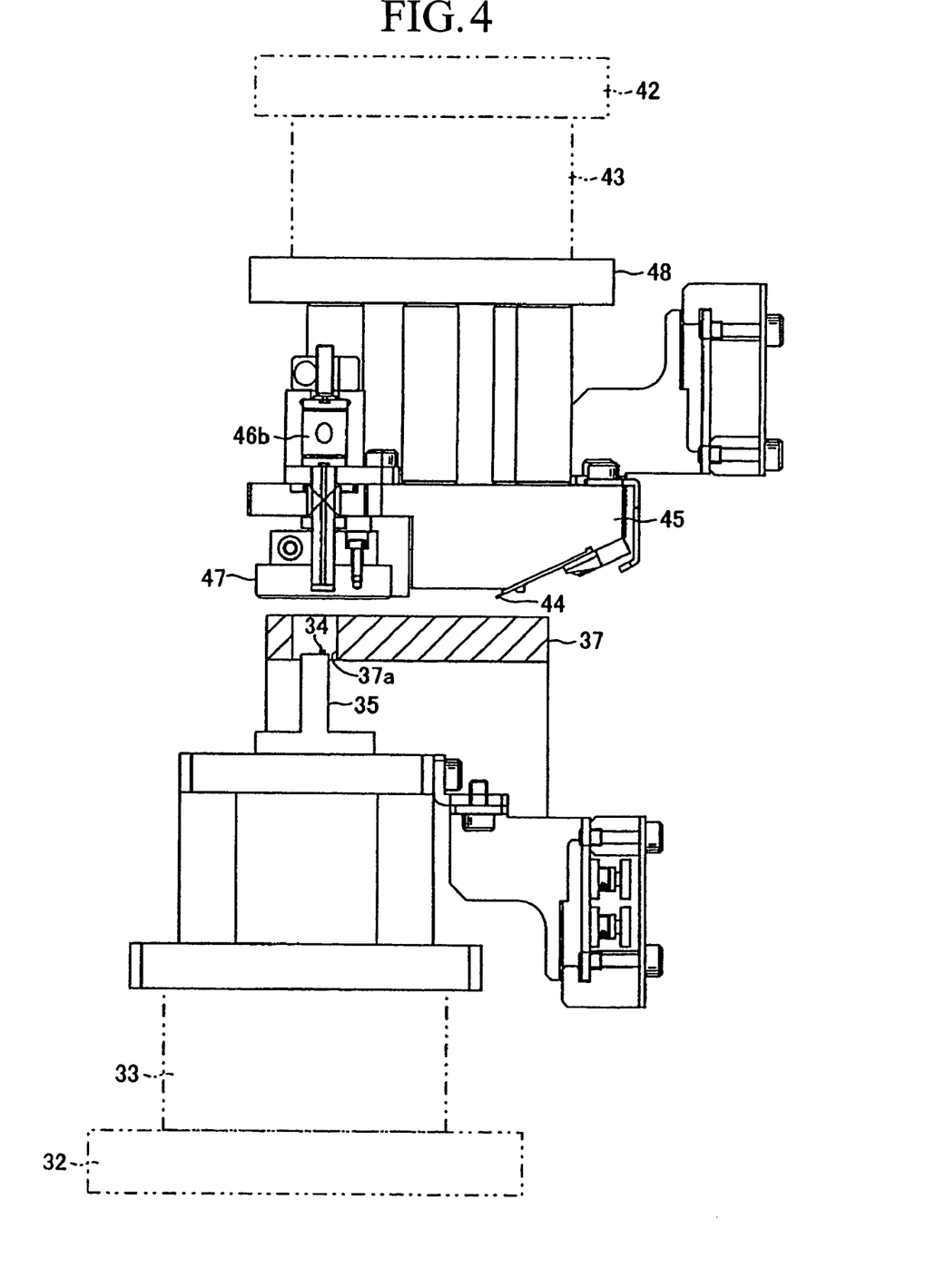
FIG. 4 is an enlarged view showing parts arranged inside of a certain portion of the electrical inspection apparatus encompassed by a dashed-line circle in FIG. 3.

The lower-side inspection unit 30 is attached to a driving section 31, which is interlocked with the drive device 17 in a movable manner. Upon being driven by the drive device 17, the lower-side inspection unit 30 can move in the longitudinal direction of the drive device 17 together with the driving section 31. The lower-side inspection unit 30 is driven by drivers (not shown) of the driving section 31 so that it can move up and down in a vertical direction and it can also rotate about a vertical axis (not shown). As shown in FIG. 1 and FIG. 4, the lower-side inspection unit 30 is equipped with a support substrate 32, wherein FIG. 4 provides an enlarged illustration with respect to a prescribed portion encompassed by a dashed-line circle in FIG. 3. For the sake of convenience, FIG. 1 provides a rough illustration compared with the illustration of FIG. 4; therefore, corresponding parts may be described differently.

An elevator 33 is arranged above the upper surface of the support substrate 32, and a detector 35 equipped with an inspection probe 34 is attached to the upper end of the elevator 33. The detector 35 can move up and down upon being driven by the elevator 33. A pair of elevator members 36a and 36b are arranged on both sides of the elevator 33 mounted on the upper surface of the support substrate 32. In addition, a lower-side fixing member 37 (referred to as a reference position regulating member in the present invention) is arranged on the upper ends of the elevator members 36a and 36b. A through hole 37a allowing the detector 35 to penetrate therethrough is formed at a prescribed position of the lower-side fixing member 37. The lower-side fixing member 37 can move up and down upon being driven by the elevator members 36a and 36b. Thus, when the lower-side fixing member 37 descends down or when the detector 35 ascends up, the upper end portion of the detector 35 penetrates through the through hole 37a above the lower-side fixing member 37.

The upper-side inspection unit 40 is attached to a support base 18 that can move along the upper surfaces of the rails 14a and 14b. Upon being driven by a rotary drive device 16b, the support base 18 can be moved along the rails 14a and 14b in left-right directions in FIG. 2, whereby it is located above the printed board 11. The support base 18 is equipped with a drive device 19 that comprises a tracking section and a rotary shaft section (not shown). The upper-side inspection unit 40 is attached to a driving section 41 that is interlocked with the drive device 19 in a movable manner. Upon being driven by the drive device 19, the upper-side inspection unit 40 can be moved in the longitudinal direction of the drive device 19 together with the driving section 41. The upper-side inspection unit 40 is driven by drivers (not shown) of the driving section 41 so that it can move up and down, and it can also rotate about a vertical axis (not shown).

The upper-side inspection unit 40 is equipped with a support substrate 42. An elevator 43 is arranged on the lower surface of the support substrate 42. In addition, a detector 45 equipped with an inspection probe 44 is attached onto a support member 48, which is arranged on the lower surface of the elevator 43. Upon being driven by the elevator 43, the detector 45 can be moved up and down. A pair of springs 46a and 46b are attached to both sides of the lower surface of the support member 48. Furthermore, an upper-side fixing member 47 (referred to as a pressing member in the present invention) is attached to lower ends of the springs 46a and 46b, wherein a through hole 47a allowing the detector 45 to penetrate therethrough is formed at a prescribed position of the upper-side fixing member 47. Due to the movement of the support member 48, the springs 46a and 46b are correspondingly forced to be contracted, wherein when the support member 48 further descends down after the upper-side fixing member 47 comes in contact with the upper surface of the lower-side fixing member 37, the springs 46a and 46b are contracted so that the lower end portion of the detector 45 penetrates through the through hole 47a below the upper-side fixing member 47. The lower-side fixing member 37 and the upper-side fixing member 47 are combined together to form an inspection unit fixing device in the present invention.

Each of the inspection probes 34 and 44 has the fine structure having prescribed dimensions in which width is set to 0.025 mm, thickness is set to 0.020 mm, and length is set to 1.200 mm, for example. Herein, an amount of deformation permitted in each inspection probe is limited to 0.2 mm or so, whereby each inspection probe has a relatively fragile structure in which it may be easily bent or destroyed due to impact applied thereto. The inspection apparatus of the present embodiment provides a microcomputer other than the aforementioned mechanical and electrical parts, so that the aforementioned rotary drive devices 16a and 16b as well as the drive sections 17 and 19 are adequately controlled in accordance with various controls implemented by the microcomputer, by which the aforementioned detectors 35 and 45 are adequately moved and located at prescribed positions therefor.

When an electrical conduction inspection is performed on the printed board 11 by use of the inspection apparatus 10 having the aforementioned structure, the printed board 11 is set to the setup unit 20, wherein the support devices 20a and 20b are moved relatively with each other in such a way that both of the interval between the holders 25a and 25b and the interval between the holders 29a and 29b match the length of the printed board 11. Next, the support members 22a and 26a and the support members 22b and 26b are respectively moved in such a way that both of the interval between the holders 25a and 29a and the interval between the holders 25b and 29b match the width of the printed board 11. Thus, the printed board is set up in a prescribed position under tension by activating the holders 25a, 25b, 29a, and 29b to fixedly hold the corresponding four corners of the printed board 11.

By adequately activating the rotary drive device 16b as well as drives of the drive device 19 and drive section 41, the detector 45 is moved to be located above a prescribed contact 11a arranged on the upper surface of the printed board 11. Then, by activating the rotary drive device 16a as well as drives of the drive device 17 and driving section 31, the detector 35 is moved to be located below another contact 11a arranged on the lower surface of the printed board 11. Then, the elevator members 36a and 36b are driven to raise the lower-side fixing member 37 so that the upper surface of the lower-side fixing member 37 ascends up to the position for supporting the lower surface of the printed board 11. This position of the lower-side fixing member 37 matches a reference position, which is set in advance in a normal direction.

In addition, the elevator 43 is driven to lower the upper-side fixing member (or pressing member) 47 and the detector 45 so that the lower surface of the upper-side fixing member 47 descends down to the height at which it comes in contact with the upper surface of the printed board 11. Furthermore, the detector 45 is lowered to an extent that the inspection probe 44 comes into contact with the contact 11a arranged on the upper surface of the printed board 11. In this state, due to the elasticity of the springs 46a and 46b, the lower-side fixing member 37 and the upper-side fixing member 47 are respectively pressed in contact with the lower surface and upper surface of the printed board 11 so that they are located to fixedly press the proximity areas of the contacts 11a respectively arranged on the lower surface and upper surface of the printed board 11. Herein, the descending movement of the upper-side fixing member (or pressing member) 47 is automatically stopped upon contact with the printed board 11; thereafter, the detector 45 descends down until coming in contact with the contact 11a while the springs 46a and 46b are correspondingly contracted.

Next, the elevator 33 is driven so as to raise the detector 35 upwardly so that the inspection probe 34 is brought into contact with the contact 11a arranged on the lower surface of the printed board 11. Then, an electrical conduction inspection is performed by performing a detection as to whether or not an electrical conduction is established with respect to the contacts 11a. After completion of the electrical conduction inspection, the aforementioned drives are activated backwardly so that the detector 35 and the lower-side fixing member 37 are lowered to their original positions, and the detector 45 is raised to its original position. By repeatedly performing the aforementioned operation, the detectors 35 and 45 are respectively moved so as to perform an electrical conduction inspection with respect to the next inspected position of the printed board 11. By repeating this operation, all parts of the printed board 11 can be completely inspected.

In order to perform an electrical conduction inspection on another printed board having a different size and shape, the holders 25a, 25b, 29a, and 29b are deactivated to release holding on the four corners of the "inspection-completed" printed board 11, which is thus removed from the inspection apparatus 10; then, another printed board, which is a next subject for inspection, is set into the setup unit 20. Herein, by performing the aforementioned operation, the holders 25a, 25b, 29a, and 29b are respectively positioned and adequately distanced apart from each other in conformity with the four corners of the printed board. Then, they fixedly hold the four corners of the printed board, which is thus precisely installed in the inspection apparatus 10. In this case, an electrical conduction inspection is performed in accordance with the aforementioned procedures.

In the inspection apparatus 10 of the present embodiment, the printed board 11 is set up at the reference position so that the upper-side fixing member (or pressing member) 47 presses the surrounding area of the contact 11a of the printed board 11, which is subjected to inspection. This precisely makes the inspected area of the printed board 11 substantially planar, which allows an inspection with a good accuracy. In this case, each of the inspection probes 34 and 44 can establish a good contact with the contact 11a in an appropriate manner, whereby it is possible to reliably prevent the inspection probes 34 and 44 from being unexpectedly damaged.

In addition, the present embodiment is characterized by that the setup unit 20 comprising the holders 25a, 25b, 29a, and 29b, which can be adequately moved in conformity with the size of the printed board 11. Therefore, it is possible to reliably set the printed board 11 at the prescribed positioning while maintaining it substantially planar in its local area (e.g., the contact 11a and its proximate area) even though the printed board 11 is made of a flexible sheet-like substrate, regardless of the size of the printed board 11. This allows each of the inspection probes 34 and 44 to be brought into contact with the contact 11a of the printed board 11 with ease, which yields a good accuracy in electrical conduction inspection.

In addition, the setup unit 20 can deal with any type of the printed board therein. This eliminates the necessity of selectively using various types of instruments, which should be changed to match each type of the printed board conventionally. Thus, it is possible for a manufacturer to perform inspection efficiently and to reduce the overall cost for the inspection. In addition, an electrical conduction inspection is performed in such a way that the inspection probes 34 and 44 are simultaneously brought into contact with the lower surface and upper surface of the printed board 11, which contributes to a remarkable improvement in inspection efficiency. Furthermore, the inspected area and its proximate area of the printed board 11 are fixedly held by use of the lower-side fixing member 37 and the upper-side fixing member 47. This guarantees fixation of the contact 11a of the printed board at the prescribed position such that each of the inspection probes 34 and 44 can be easily brought into contact therewith. That is, each of the inspection probes 34 and 44 can be reliably brought into contact with the contact 11a of the printed board 11; thus, it is possible to noticeably improve inspection accuracy.

The present embodiment described above can be modified to additionally provide absorbing members for absorbing the printed board 11 in the lower-side fixing member 37 and the upper-side fixing member 47. This may further improve the fixation of the printed board 11 held between the fixing members. In the aforementioned embodiment, the detectors 35 and 45 are sequentially and independently moved to conform with the printed board 11 prior to inspection. Instead, it is possible to modify the present embodiment in such a way that they are simultaneously moved in synchronization with each other. This contributes to a reduction in the inspection time. In addition, the present embodiment handles the "flexible" printed board 11, for example. Of course, the printed board 11 is not necessarily limited to the flexible printed board; hence, it is possible to use a plate-like printed board having rigidity. Even when such a printed board is installed in the inspection apparatus, it is possible to reliably perform an electrical conduction inspection similarly to the aforementioned embodiment.

Furthermore, it is possible to use a printed board that is wound up in a roll. In this case, the aforementioned setup unit is partially modified to provide a pair of support shafts that are arranged opposite to each other, wherein one support shaft supports a feed-side roller, and another support shaft supports a winding-side roller. In this case, it is possible to perform electrical conduction inspections while sequentially feeding printed boards wound up in the roller; hence, it is possible to further improve inspection efficiency. Alternatively, the setup unit is modified to support both ends of a slender band-like printed board, which is subjected to inspection.

In the aforementioned embodiment, the detectors 35 and 45 are arranged in the lower-side and upper-side with respect to the printed board 11 respectively. Of course, it is possible to provide only one detector in one side of the printed board 11. In addition, it is possible to adopt continuous control (allowing positioning to be continuously varied between two sides) or two-way positioning control (allowing positioning to be set to one of two sides) in movement for each of the elevators 33 and 43 in a Z-axis direction. Furthermore, the aforementioned embodiment is basically designed to perform an electrical conduction inspection, which is not necessarily restricted. Hence, it is possible to perform insulation inspection or measurement of circuit constants such as resistance, capacitance, and inductance.

The aforementioned embodiment is designed such that the reference position regulating member is brought into contact with the printed board, which is horizontally set up in position and is pressed by the pressing member. Of course, it is possible to arbitrarily set the direction of the printed board installed in the inspection apparatus. For example, it is possible to set up the printed board in a slanted manner or in a vertical manner in position. Therefore, the inspection apparatus can be adequately modified to cope with any direction of the printed board in such a way that the reference position regulating member is brought into contact with the printed board, which is pressed by the pressing member. The relationship between the reference position regulating member and the pressing member is not necessarily limited to the aforementioned one described in the present embodiment and can be reversed in up/down positioning. Moreover, all other parts of the inspection apparatus 10 can be adequately changed or modified within the technical scope of the present invention.

Incidentally, the aforementioned embodiment requires that the reference position regulating member and pressing member be arranged to partially overlap with each other in their projecting surfaces; therefore, they are not necessarily limited in contact areas with the printed board, sizes, and setup positions as described in the aforementioned embodiment. For example, one of the reference position regulating member and the pressing member can be greater in size compared with the other. In addition, it is possible to arrange the pressing member in an offset manner relative to the reference position regulating member in the setup direction of the printed board (i.e., the direction parallel to the board surface).

Figure 7A:
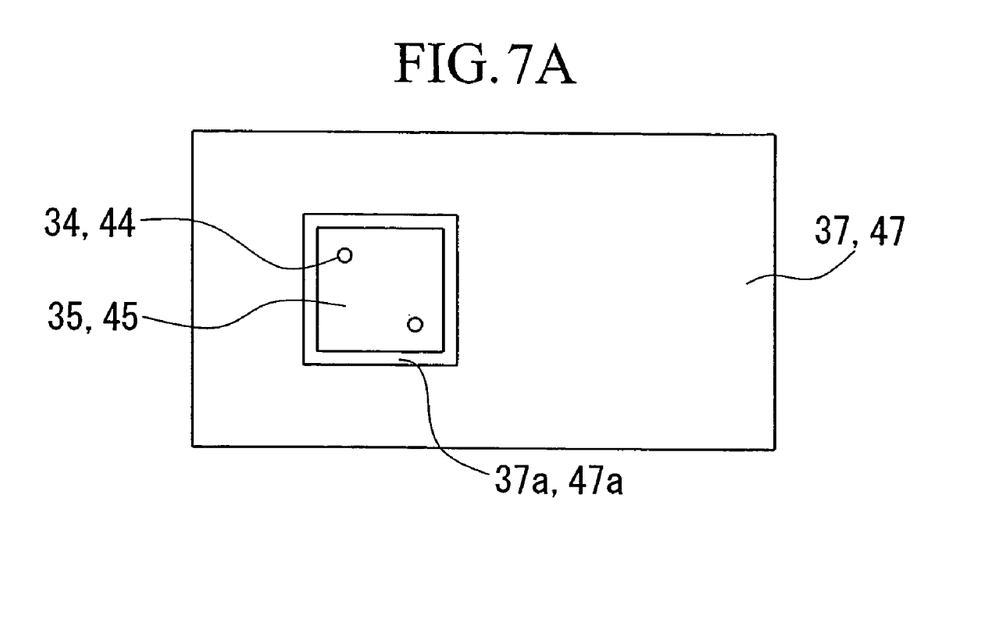
FIG. 7A is a plan view showing a first or second fixing member having a through hole through which a detector penetrates.
Figure 7B:
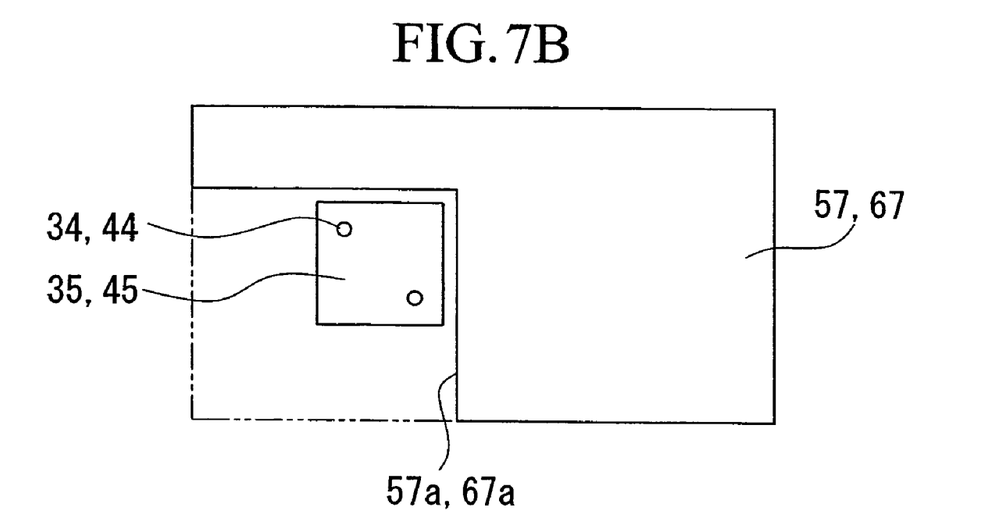
FIG. 7B is a plan view showing a first or second fixing member that is modified to provide a cutout portion through which a detector penetrates.

The present embodiment is designed in such a way that the lower-side fixing member 37 and the upper-side fixing member 47 have the through holes 37a and 47a, which allow the detectors 35 and 45 to penetrate therethrough as shown in FIG. 7A. It is possible to modify the present embodiment in such a way that as shown in FIG. 7B, a lower-side fixing member 57 and an upper-side fixing member 67 having cutout portions 57a and 67a are substituted for the lower-side fixing member 37 and the upper-side fixing member 47 respectively. Herein, the detectors 35 and 45 can be moved through the cutout portions 57a and 67a to project from the lower-side fixing member 57 and the upper-side fixing member 67 respectively.

Figure 5:
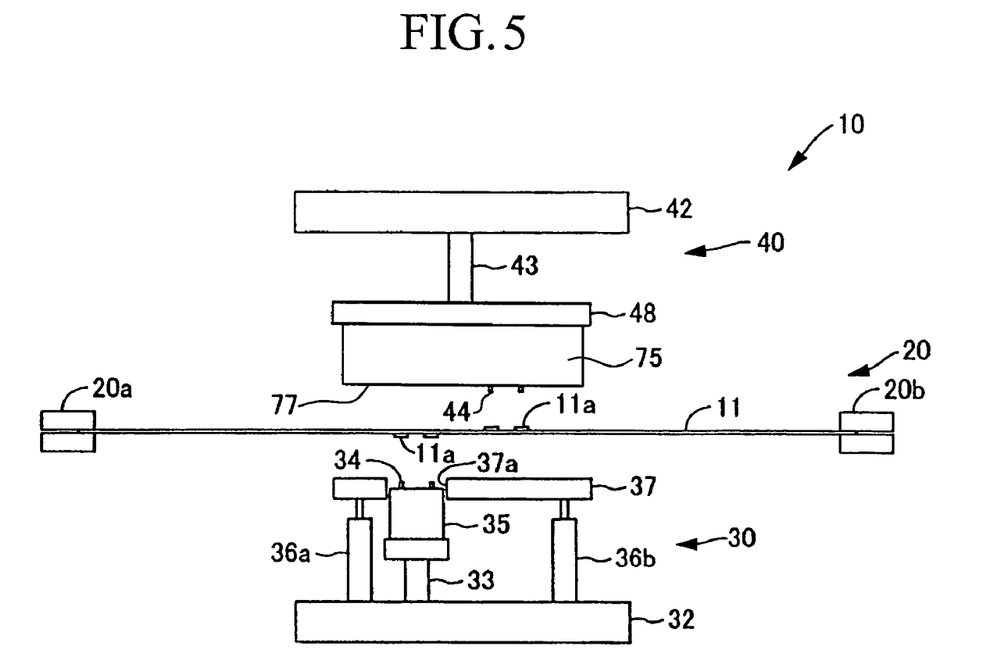
FIG. 5 is a simplified illustration showing essential parts of the electrical inspection apparatus that is partially modified compared with the constitution shown in FIG. 1.

In addition, the present embodiment shown in FIG. 1 can be modified as shown in FIG. 5, wherein compared with the aforementioned constitution shown in FIG. 1, the upper-side fixing member 47 and the springs 46a and 46b are excluded, and a detector 75 is directly attached to the lower surface of the support member 48 and is brought into contact with the printed board 11, which is thus subjected to inspection while being held between the detector 75 and the lower-side fixing member 37.

Figure 6A:
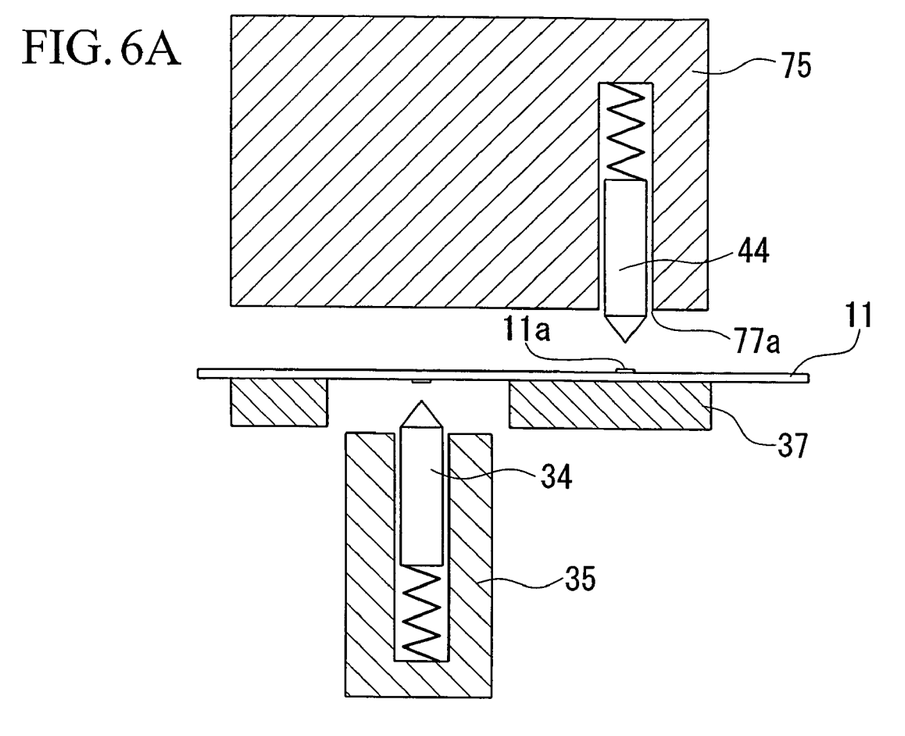
FIG. 6A is an enlarged cross sectional view showing prescribed parts of the electrical inspection apparatus of FIG. 5, which are set up at prescribed positions for an electrical inspection.
Figure 6B:
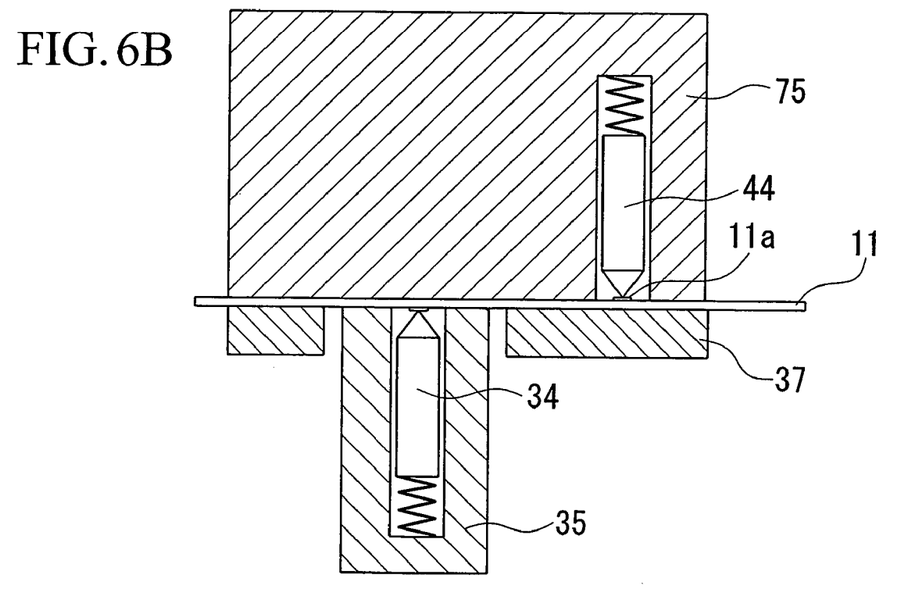
FIG. 6B is an enlarged cross sectional view showing prescribed parts of the electrical inspection apparatus of FIG. 5, in which a printed board is subjected to electrical inspection.

Specifically, as shown in FIG. 6A, a probe 44 is retractably arranged inside of a hole 77a, which opens on a lower surface 77 of the detector 75, and is connected with the stop of the hole 77a with a spring, whereby when the detector 75 descends down as shown in FIG. 6B, the lower surface 77 of the detector 75 comes in contact with the printed board 11 so as to realize a pressing function for pressing the printed board 11. At this time, the probe 44 is retracted inside of the hole from the lower surface 77 of the detector 75, whereby only the tip end of the probe 44 can be brought into contact with the contact 11a on the printed board 11 via the opening of the lower surface 77 of the detector 75. The aforementioned modification realized in the upper-side inspection unit 40 can be similarly adopted in the lower-side inspection unit 30, wherein a probe 34 is retractably inserted into a hole, which opens on the upper surface of the detector 35, and is connected with the stop of the hole with a spring.

When the contact 11a is smaller than the widths of the holes 37a, 47a, and 77a respectively, the lower-side fixing member 37, the upper-side fixing member 47, and the lower surface 77 of the detector 75 are respectively brought into direct contact with the printed board 11.

When the contact 11a is larger than the widths of the holes 37a, 47a, and 77a respectively, the lower-side fixing member 37, the upper-side fixing member 47, and the lower surface 77 of the detector 75 are respectively brought into contact with the peripheral portion of the contact 11a on the printed board 11.

When the printed board 11 is covered with a protective cover layer (not shown) surrounding the contact 11a, the lower-side fixing member 37, the upper-side fixing member 47, and the lower surface 77 of the detector 75 are respectively brought into contact with the protective cover layer.

As described heretofore, this invention has a variety of effects and technical features, which will be described below.

(1) An electrical inspection apparatus of this invention is designed to bring at least one inspection probe into contact with at least one surface of a printed board, which is subjected to electrical inspection. It comprises a reference position regulating member (or a lower-side fixing member) that comes in contact with a first surface of the printed board so as to regulate the printed board to be located at a predetermined reference position in the normal direction, and a pressing member (or an upper-side fixing member), which applies pressure to a second surface of the printed board so that the printed board is pressed against the reference position regulating member within its certain area opposite to the reference position regulating member. Specifically, the inspection probe is brought into contact with a prescribed inspected portion of the printed board, which differs from a first area in which the reference position regulating member comes in contact with the first surface of the printed board and a second area in which the pressing member presses the second surface of the printed board, so that upon electrification using the inspection probe, an electrical inspection (e.g., an electrical conduction inspection) is performed with respect to the printed board.

(2) In the above, the printed board is automatically set up at the reference position by bringing the reference position regulating member into contact with a prescribed portion of the printed board (corresponding to the first area). In addition, the pressing member applies pressure in the direction opposite to the reference position regulating member so as to press the second surface of the printed board, which is thus pressed against the reference position regulating member. Therefore, the printed board can be reliably and accurately fixed at the predetermined reference position, which brings a relatively high accuracy in the electrical inspection. Furthermore, the inspection probe can be appropriately and accurately brought into contact with a prescribed contact arranged on the printed board; therefore, it is possible to prevent the inspection probe from being unexpectedly damaged.

(3) Due to the aforementioned structure of the electrical inspection apparatus, it is possible to set up any type of the printed board (e.g., plate-like printed boards having rigidity, and flexible printed boards) in a planar condition relative to the reference position. In addition, the prescribed portion of the printed board at which an electrical inspection is performed can be fixed to the reference position by being held between the reference position regulating member and the pressing member. As a result, it is possible to reliably set up the printed board precisely at the reference position in the planar condition, regardless of the shape and material of the printed board. Thus, it is possible to perform an electrical inspection with a relatively high accuracy.

(4) It is possible to provide the reference position regulating member with an absorbing member for absorbing the printed board. This may bring a further improvement in fixation of the printed board.

(5) The inspection probe can be arranged in the second surface of the printed board relative to the pressing member. That is, the inspection probe is brought into contact with the second surface of the printed board, which is set up at the reference position by the reference position regulating member, in the direction opposite to the reference position regulating member. This actualizes the inspection probe to be precisely located in contact with a prescribed contact of the printed board accurately positioned at the reference position. As a result, it is possible to perform an electrical inspection with relatively high accuracy. In addition, it is possible to prevent an excessive force from being applied to the inspection probe, which is thus prevented from being unexpectedly damaged.

(6) The pressing member defines the reference position when it comes in contact with the printed board that is regulated in position upon contact with the reference position regulating member.

(7) The inspection probe can be arranged opposite to the pressing member with respect to the printed board. In this case, the inspection probe is brought into contact with the printed board, which is positioned at the reference position, in the same side with the reference position regulating member. Herein, the pressing member is arranged oppositely to the inspection probe with respect to the printed board; therefore, it is possible to bring the inspection probe into contact with the reference position accurately at the reference position. In summary, under the conditions in which the pressing member presses the printed board that is regulated in positioning upon contact with the reference position regulating member, the inspection probe is adequately brought into contact with a prescribed inspected portion of the printed board accurately located at the reference position. Thus, it is possible to perform an electrical inspection with a relatively high accuracy while reliably preventing the inspection probe from being damaged or destroyed.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. An electrical inspection apparatus comprising:
    a reference position regulating member, which is brought into contact with a first surface of a printed board so as to fix the printed board at a reference position with respect to a normal direction;
    a pressing member, which is brought into contact with a second surface of the printed board opposite to the first surface so as to hold the printed board at the reference position with the reference position regulating member; and
    at least one inspection probe that is brought into contact with the printed board, the apparatus being adapted such that the at least one inspection probe may be:
    (a) brought into contact with the printed board so as to be arranged in a direction of said first surface of the printed board and guided by said reference position regulating member so as to contact with a prescribed position of said first surface of the printed board which differs from a first area in which said reference position regulating member is brought into contact with the printed board, and/or
    (b) brought into contact with the printed board so as to be arranged in a direction of said second surface of the printed board and guided by said pressing member so as to contact with a prescribed position of said second surface of the printed board which differs from a second area in which said pressing member is brought into contact with the printed board.

2. The electrical inspection apparatus according to claim 1, wherein the pressing member defines the reference position when it comes in contact with the printed board that is regulated in position upon contact with the reference position regulating member.

3. The electrical inspection apparatus according to claim 1, wherein at least one absorbing member is arranged for either the reference position regulating member or the pressing member.

4. The electrical inspection apparatus according to claim 3, wherein the pressing member defines the reference position when it comes in contact with the printed board that is regulated in position upon contact with the reference position regulating member.

5. The electrical inspection apparatus according to claim 1, wherein the at least one inspection probe is arranged in a direction accompanied with either the reference position regulating member or the pressing member with respect to the printed board.

6. The electrical inspection apparatus according to claim 5, wherein the pressing member defines the reference position when it comes in contact with the printed board that is regulated in position upon contact with the reference position regulating member.

7. The electrical inspection apparatus according to claim 1, wherein said at least one inspection probe comprises a plurality of inspection probes arranged relative to both of the reference position regulating member and the pressing member with respect to the printed board.

8. The electrical inspection apparatus according to claim 7, wherein the pressing member defines the reference position when it comes in contact with the printed board that is regulated in position upon contact with the reference position regulating member.

9. The electrical inspection apparatus according to claim 1, wherein under a condition where the reference position regulating member is placed in contact with the first surface of the printed board, the at least one inspection probe is brought into contact with the second surface of the printed board at a position that differs from a position at which the pressing member presses the second surface of the printed board within an area in which the pressing member is located opposite to the reference position regulating member with respect to the printed board, thus performing the electrical inspection.

10. The electrical inspection apparatus according to claim 1, wherein the reference position regulating member has a through hole, so that under a condition where the pressing member presses the second surface of the printed board, the at least one inspection probe is brought into contact with the first surface of the printed board via the through hole, thus performing the electrical inspection.

11. The electrical inspection apparatus according to claim 1, wherein at least one of the reference position regulating member and the pressing member has a through hole, which allows the at least one inspection probe to penetrate therethrough and to come in contact with the printed board.

12. The electrical inspection apparatus according to claim 1, wherein at least one of the reference position regulating member and the pressing member has a cutout portion, which allows the at least one inspection probe to project therethrough and to come in contact with the printed board.

13. The electrical inspection apparatus according to claim 1, wherein the at least one inspection probe comprises a plurality of inspection probes, the apparatus further comprising at least one of an upper-side detector equipped with a first of the plurality of inspection probes and a lower-side detector equipped with a second of the plurality of inspection probes,
    wherein said upper-side detector comprises a lower surface that functions as the pressing member, and a hole having an opening on the lower surface in which the first inspection probe is installed to be retracted from the opening of the lower surface,
    and wherein said lower-side detector comprises an upper surface that functions as the reference position regulating member, and a hole having an opening on the upper surface in which the second inspection probe is installed to be retracted from the opening of the upper surface.

* * * * *